United States Patent [19]

Ting et al.

[11] Patent Number: 5,183,795
[45] Date of Patent: Feb. 2, 1993

[54] FULLY PLANAR METALIZATION PROCESS

[75] Inventors: Chiu H. Ting, Saratoga; Pei-Lin Pai, Cupertino, both of Calif.

[73] Assignee: Intel Corporation, Santa Clara, Calif.

[21] Appl. No.: 774,372

[22] Filed: Oct. 10, 1991

Related U.S. Application Data

[63] Continuation of Ser. No. 660,922, Feb. 27, 1991, abandoned, which is a continuation of Ser. No. 450,180, Dec. 13, 1989, abandoned.

[51] Int. Cl.$^5$ .......................................... H04L 21/02
[52] U.S. Cl. ...................................... 437/230; 437/24; 437/187; 437/195; 437/245; 148/DIG. 50; 427/437; 427/304; 427/305
[58] Field of Search ............... 437/230, 200, 201, 189, 437/187, 24, 245; 427/304, 305, 98, 437

[56] References Cited

U.S. PATENT DOCUMENTS

| | | | |
|---|---|---|---|
| 4,088,799 | 5/1978 | Kurtin | 437/20 |
| 4,339,305 | 7/1982 | Jones | 437/230 |
| 4,448,804 | 5/1984 | Amelio et al. | 427/307 |
| 4,574,095 | 3/1986 | Baum et al. | 427/305 |
| 4,639,380 | 1/1987 | Amelio et al. | 427/306 |
| 4,692,349 | 9/1987 | Georgiou et al. | 437/230 |
| 4,746,621 | 5/1988 | Thomas et al. | 437/195 |
| 4,814,285 | 3/1989 | Matlock et al. | 437/194 |
| 4,822,633 | 4/1989 | Inoue | 427/53.1 |
| 4,832,988 | 5/1989 | Bogenschiitz et al. | 427/305 |
| 4,832,989 | 5/1989 | Giesecke et al. | 427/305 |
| 4,843,034 | 6/1989 | Herndon et al. | 437/189 |
| 4,954,214 | 9/1990 | Ho | 437/228 |

OTHER PUBLICATIONS

Vossen; "Thin Film Process"; 1978; pp. 3-7 and pp. 11-19.

Ghandhi, "VLSI Fabrication/Principles"; 1983; pp. 348-352 and pp. 437-439.

"Selective Electroless Deposition for Via Filling", by P. L. Pai, M. Paunovic, A. T. Wu, G. Chiu, D. Carl, J. Cho, S. Kuo, C. H. Ting; 1988 Proceedings Fifth International IEEE VLSI Multilevel Interconnection Conference.

"Thin Film Processes", Vossen et al., 1978, pp. 209-221.

*Primary Examiner*—Brian E. Hearn
*Assistant Examiner*—Trung Dang
*Attorney, Agent, or Firm*—Blakely, Sokoloff Taylor & Zafman

[57] ABSTRACT

A planar interconnect using selective, electroless deposition of a metal such as copper into interconnect channels is disclosed. A first dielectric layer is deposited on the surface of a substrate, such as an integrated circuit wafer. Thereafter, a second dielectric layer is formed on the first dielectric layer. Then a photoresist layer is spun on the top surface of the second dielectric layer. Channels are formed in the dielectric layers by patterning and etching the composite dielectric layers. Silicon atoms are implanted in the bottom of the interconnect channels and then the metal layer is selectively, electrolessly deposited to fill the channels in the first dielectric film, thus forming a level of interconnect. This process is repeated to form subsequent levels of interconnect.

13 Claims, 3 Drawing Sheets

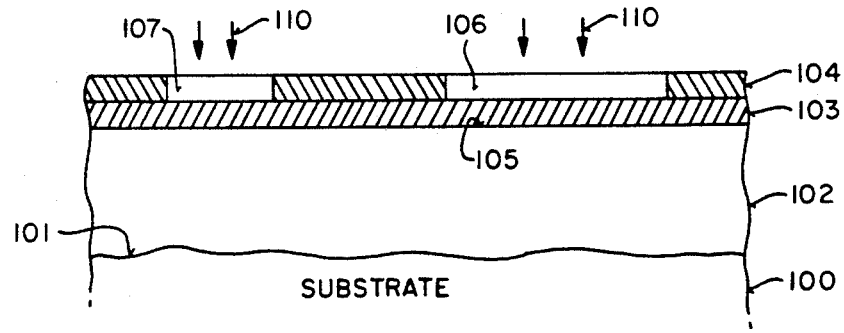
FIG_1 (PRIOR ART)
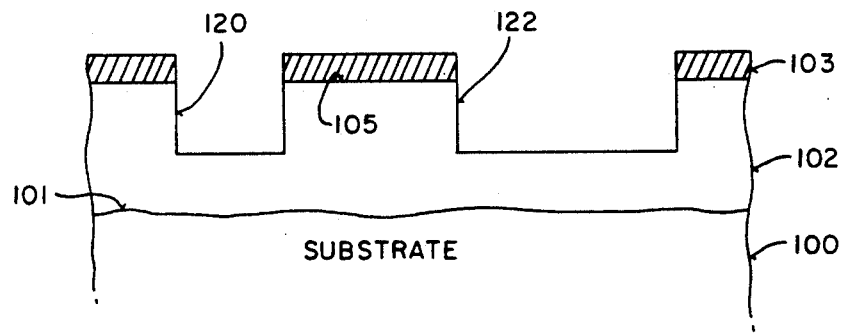
FIG_2 (PRIOR ART)
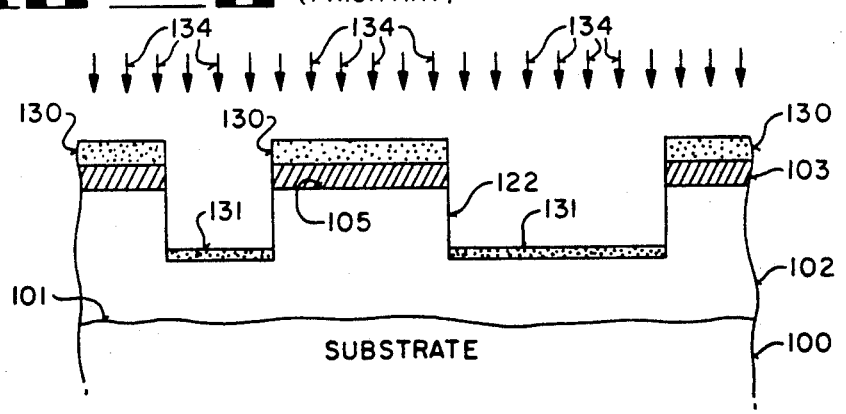
FIG_3 (PRIOR ART)
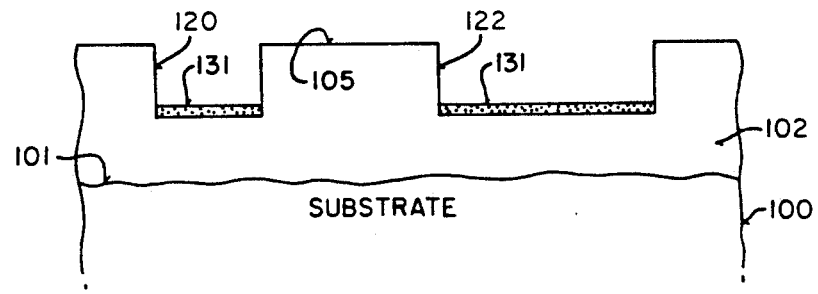
FIG_4 (PRIOR ART)

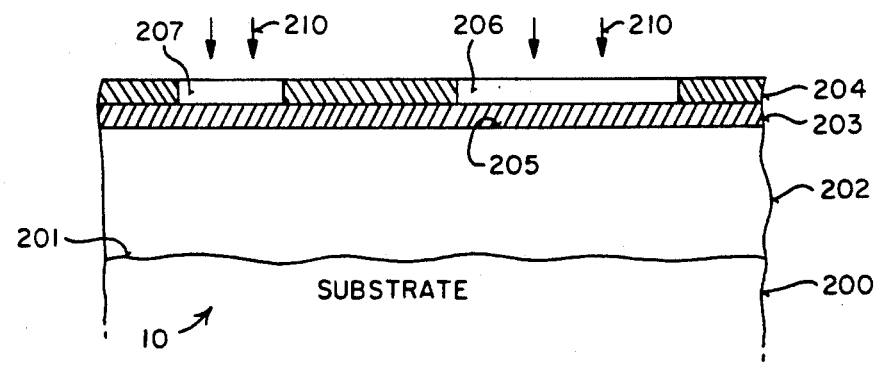
FIG_5
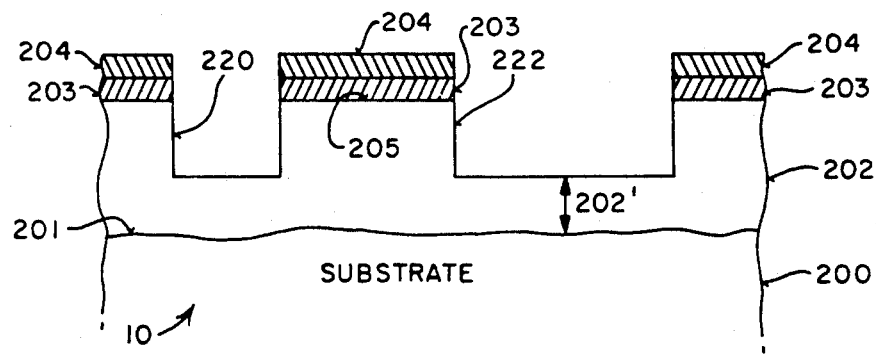
FIG_6
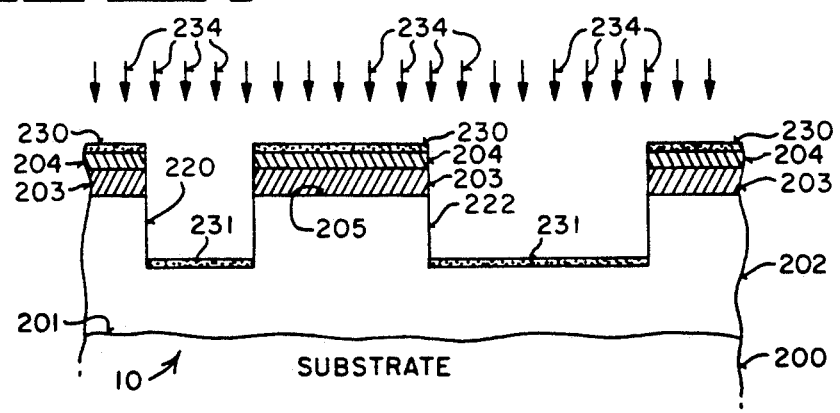
FIG_7
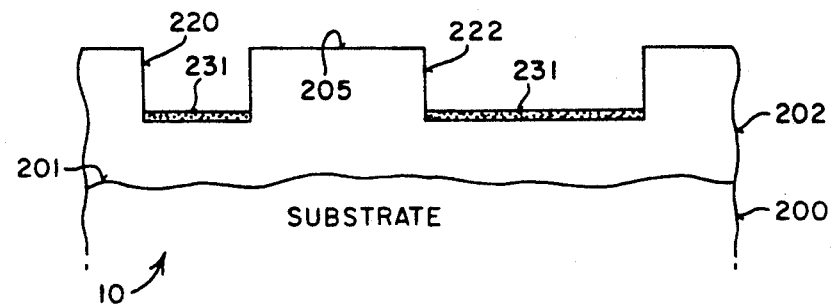
FIG_8

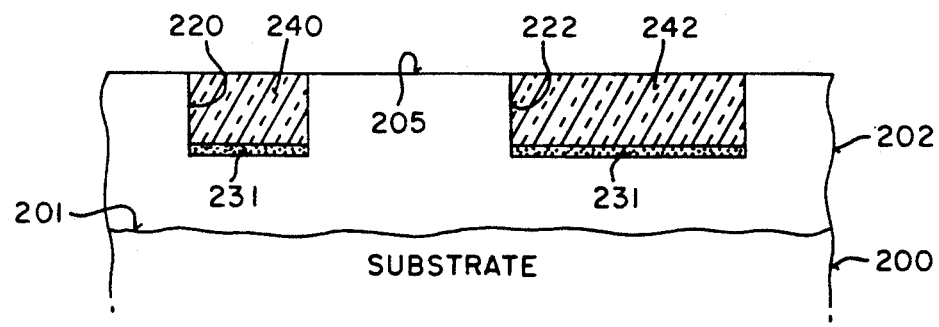
FIG_9

FULLY PLANAR METALIZATION PROCESS

This is a continuation of application Ser. No. 07/660,922, filed Feb. 27, 1991, abandoned, which is a continuation of application Ser. No. 07/450,180, filed Dec. 13, 1989, abandoned.

BACKGROUND OF THE INVENTION

1. Field of the Invention

This present invention relates to very large scale integration (VLSI) Technology and particularly to a method of forming fully planar interconnections in VLSI devices.

2. Prior Art

As the scale of integration increases and device dimensions decrease, the performance of VLSI chips are limited by interconnection capabilities. For example, VLSI technology for 1-micrometer processes requires a greater control on the materials and techniques that are well beyond that of only slightly larger 2-micrometer processes. While the dimension is scaled in half, the degree of difficulty can increase in the range of 5-10 times. Furthermore, as the number of layers of interconnection increases, even more stringent requirements are placed on interconnection characteristics.

As the device is scaled down, the operating speed generally increases, the component density increases and the power density generally remains constant. However, the current density is also increased and is generally the limiting characteristic for dense high performance devices. Therefore, low resistivity interconnection paths are critical in order to fabricate dense, high performance devices produced with VLSI technology.

Generally, metal conductors have an upper current density limit imposed by electromigration. The term electromigration generally refers to the transport of metal atoms under the influence of current. It occurs by the transfer of momentum by the electrons to the positive metal ions. When a high current passes through thin metal conductors in integrated circuits, metal ions will pile-up in some regions and voids will form in other regions. This pile-up can short circuit adjacent conductors, while the voids can result in an open circuit. The medium time to failure (MTF) of a conductor due to electromigration can be related to the current density and the activation energy associated with the metal conductor used.

Traditionally, aluminum and its alloys are used extensively for metalization and interconnection lines in integrated circuits. Since aluminum and its alloys have low resistivities, this satisfies the critical requirement of low resistance. Aluminum also adheres well to silicon dioxide.

However, the use of aluminum in VLSI with its shallow junctions often creates problems such as junction spiking and electromigration. Experimentally, it has been determined that aluminum has an activation energy value of approximately 0.5 eV for electromigration. This activation energy dictates the upper limit of the current density allowable before breakdown or electromigration effects are observed. The electromigration resistance can be increased by using several techniques, such as including copper, encapsulating the conductor with a refractory metal or incorporating oxygen during film deposition. However, the current technologies using aluminum as the metalization layer generally produce poor reliability and not low enough resistivity interconnect paths for future applications. These two factors create a severe trade off between denser circuits and high speed performance.

As circuit geometries are scaled down to technology limits, the interconnection path usually slows down the operating frequency due to its parasitic capacitance and resistance. Only a few materials can provide better electrical and reliability potentials than aluminum. Due to their higher activation energies of self diffusion, copper, gold and silver generally do not suffer the same problems as aluminum. Of these three metals available for interconnectors, silver is easily corroded. As a result, copper, silver, and gold are natural choices for the interconnection requirements of VLSI technology.

While copper, silver, and gold films may be a natural choice, they are extremely difficult to pattern. Wet etching is not VLSI compatible because it typically causes severe loss of pattern fidelity. On the other hand, copper, silver, and gold are extremely difficult to etch by the current plasma dry etching processes.

Copper, as well as gold, and silver film has an activation energy of self-diffusion considerably higher than that of aluminum, thus permitting them to operate at considerably higher current densities than the aluminum films without suffering from electromigration effects. A phenomena related to electromigration is the stress migration problem. In stress migration, voids or protrusions will form under the influence of external stress such as passivation films or temperature cycles, even in the absence of current flow. Both copper and gold show much higher stress migration resistance than aluminum.

In addition to the electromigration and stress migration problems of aluminum films, most interconnection technology used in VLSI circuit fabrication requires the metal film to be deposited by sputtering, evaporation or chemical vapor deposition techniques. Once the film is deposited, the film is then patterned by lithography and etching. This process has two major disadvantages. First, the patterned metal film generates surface topography, complicating subsequent deposition and lithographic processes. Second, due to the difficulty of deposition and etching, some films with low resistivity and high electromigration resistance such as copper and gold cannot be used.

Therefore, what is required is a process that provides planar topographies in addition to allowing the use of high electromigration and stress migration resistance metals such as copper, silver or gold.

SUMMARY OF THE INVENTION

The present invention is directed to a planar interconnect technique based on selective electroless deposition of metal, such as copper, silver or gold. The traditional approach to metalization by depositing, patterning and etching a metal layer usually requires a large number of elaborate planarization process steps to be performed on the wafer surface to restore the planar surface. This is to provide a planar surface for the next layers that will be deposited. Thus, the present invention eliminates the necessity of a separate planarization process. Furthermore, the present invention overcomes the problem of wet and dry etching of metal, such as copper, silver or gold, which currently are difficult to pattern without loss of pattern fidelity.

The present invention avoids this by selectively, electrolessly depositing copper, silver or gold into interconnect channels. This not only reduces the number of fabrication steps involved, but it also produces a planarized surface. Furthermore, the present invention allows the use of copper, silver or gold for interconnect lines. Copper, silver and gold have a high resistance to electromigration and stress migration so that the width of the metal lines plus the width of the space between the interconnect lines can be substantially reduced, as required by very large scale integration (VLSI).

In accordance with the present invention, after completion of the individual devices, an electrically insulated dielectric layer is deposited on the surface of the wafer or other device, to a thickness greater than the desired total thickness of the interconnect line and intermetal dielectric film. This first dielectric layer is then planarized using any well-known process of planarization. The planarization process provides an upper planar surface and leaves the dielectric layer at a thickness close to the desired total thickness of the interconnect line and inter-layer dielectric film. A contact hole is then patterned in the dielectric layer to provide connections to the substrate. The contact holes or via holes can be partially or fully filled to provide the desired planarity. A thinner, photoresist layer that functions as a mask layer is then deposited on the first dielectric layer. An optional masking dielectric layer, different from the previous dielectric film may be deposited prior to the deposition of the photoresist layer. The photoresist layer is then patterned and etched into the dielectric film to form interconnect channels. If the optional masking dielectric film is present, the upper photoresist layer is then removed, again using any of the well-known methods of removing the upper layer. Silicon atoms or palladium atoms are then implanted into the exposed bottom surfaces of the interconnect channels. After implantation, the photoresist or the masking dielectric film is removed.

After the modified surface, that is the surface at the bottom of the interconnect channels exposed to the silicon atom implantation, has been cleaned, rinsed and activated with the appropriate activation solution, copper, silver or gold metal is selectively, electrolessly deposited in the interconnect channels. The rate of deposition is dependant on the particular deposition solution selected. The process of forming channels and implanting silicon atoms in the bottom of the interconnect channel to facilitate the deposition of the metal lines, as well as the filling of the channels with metal, is repeated to form as many levels of interconnect as may be required, with each layer having a planar top surface to facilitate formation of additional layers without the need to carry out complex replanarization steps.

The traditional process of depositing a metal film and then patterning and etching is not desirable for films such as copper, silver or gold. The need to reduce the size of the interconnect lines must be counter-balanced by the current densities limitations that are characteristic of the current aluminum metal films. The process of the present invention allows copper, silver or gold to be used, and therefore reduces the problem of electromigration and stress migration, as copper, silver and gold have higher activation energies of self-diffusion than that of aluminum film.

Furthermore, the process of selective electroless deposition negates the necessity of having to etch copper, silver or gold, which cannot be satisfactorily wet or dry etched while maintaining pattern fidelity.

Accordingly, the foregoing process has numerous desirable features. First, patterning and etching of a metal layer are no longer required. Second, the wafer surface is completely planar after each level of interconnect formation. Furthermore, the use of a copper, silver or gold metal and its resulting lines exhibit low resistivity and are capable of carrying high current density. Since both characteristics are desirable for VLSI fabrication, the process and structure of the present invention overcomes the problems encountered in the Prior Art.

BRIEF DESCRIPTION OF THE DRAWINGS

FIGS. 1-4 illustrate in sectional view the Prior Art fabrication techniques of patterning interconnect trenches.

FIGS. 5-9 illustrate in sectional view, the fabrication steps of patterning interconnect channels and depositing copper or gold in the channels using the present invention.

DETAILED DESCRIPTION OF THE PRESENT INVENTION

An invention is described that provides for a fully planar metalization process that advantageously uses the low resistivity and high electromigration resistance characteristics of copper or gold in forming interconnects in VLSI devices. In the following description, numerous specific details are set forth such as specific thicknesses in order to provide a thorough understanding of the present invention. It will be obvious, however, to one skilled in the art that the present invention may be practised without these specific details. In other instances, well known processes have not been described in detail in order not unnecessarily obscure the present invention.

PRIOR ART OF DEPOSITION AND ETCHING PROCESSES

FIGS. 1-4 illustrative a Prior Art process for forming a single level of metalization for interconnect lines. The technology is illustrated in several figures as producing an interconnect level on a substrate 100, which may be a silicon wafer wherein the wafer carries a large number of VLSI components, interconnected by conductive lines or interconnects. As illustrated in FIG. 1, the substrate 100 has a nonplanar surface 101 which incorporates a circuit device (not shown) carried on the wafer, and onto which a layer 102 of silicon dioxide is deposited. For example, the silicon dioxide layer 102 might be deposited by using the well known process of chemical vapor deposition. The layer 102 is deposited to be slightly thicker than the desired thickness of the interconnect lines to be deposited. The layer 102 is then processed to a predetermined thickness to provide a planar top surface 105. Thereafter, a silicon nitride layer 103 is deposited on top of the silicon dioxide layer 102. Layer 103 acts as a mask for an ion implantation, which is performed in a later step.

A photoresist layer 104 is spun onto the top surface of layer 103. The photoresist layer 104 is exposed and developed using conventional techniques to define an aperture such as 106 and 107. The apertures 106 and 107 define areas of removal for layers 102 and 103 in a subsequent etching step. The photoresist layer 104 acts as a mask for the etching step, which may take place in a reactive ion etcher. The etching step is illustrated diagrammatically by the arrows 110.

After the etching step is completed and the photoresist mask layer 104 is removed as illustrated in FIG. 2, interconnect channels 120 and 122 are formed in layers 102 and 103. As illustrated, the channels 120 and 122 are formed through layer 103 and partially into layer 102. The channels 120 and 122 in layer 102 are formed to the depth desired for the thickness of the interconnect lines.

As illustrated in FIG. 3, after the photoresist layer 104 is removed, silicon atoms are implanted in the exposed surface of the silicon dioxide layer 102 and the silicon nitride layer 103. A silicon implantation layer 130 is formed in the top portion of layer 103 as well as forming a silicon implantation layer 131 in the exposed surface of layer 102 at the bottom of channels 120 and 122. The silicon ion implantation is diagrammatically illustrated by arrows 134. Typically, the implantation energy is less than 40 KeV at a dose sufficient to facilitate the seeding of a subsequent step.

After implantation of the silicon, the silicon nitride layer 103 is selectively removed with the silicon implanted layer 130.

After removal of layer 103 and the implanted silicon layer 130, a tungsten film is selectively deposited to fill the channels 120 and 122. Selective chemical vapor deposition of tungsten is generally used, since tungsten does not nucleate on unimplanted oxides. As a result it will not adhere to the top surface 105. As deposition continues, the channels 120 and 122 are filled to the level of the top surface 105, thus creating a planar surface as well as interconnect lines.

PRESENT INVENTION

The first four steps of the present invention illustrated in FIGS. 5–8 are similar to that of the Prior Art shown in FIGS. 1–4. The substrate 200 is processed prior to the creating of the interconnect level. A thick layer of dielectric film 202 is deposited on the substrate 200. The thickness of the dielectric layer 202 is equal to the sum of the thickness of the desired intermetal dielectric layer and that of the metal film. The first dielectric film 202 can be a single layer, for example a layer of silicon dioxide, or it may consist of several different layers.

A layer 204 of masking material is deposited over the dielectric film 203 and patterned using any of the well-known deposition and patterning processes. The masking layer 204, for example a photoresist layer could either be a single layer of photoresist film or a composite layer of photoresist over another inorganic film, such as silicon nitride. The mask used in this step of the preferred embodiment is a reverse of a regular metal mask and the patterns of the metal film are removed from the masking layer.

As shown in FIG. 6, the interconnect channels 220 and 222, as designated by the mask pattern are then etched into the dielectric films 203 and 202, either by well-known dry or wet etching processes. The interconnect channels 220 and 222 are designed to allow a distance between interconnect lines 240 and 242 in the range of 2 micrometers or less.

The amount of dielectric film 202 etched is the desired thickness of the metal interconnect lines. The etching step is illustrated diagrammatically in FIG. 5 by the arrows 210. Thus, the dielectric film 202' left under the metal interconnect line has the desired intermetal dielectric thickness.

Once the channels 220 and 222 are formed, the exposed surface at the bottom of said channels 220 and 222 and the photoresist layer 204 are submitted to silicon ion implantation. The implantation step is diagrammatically illustrated by the arrows 234.

A typical implantation process uses a 40 KeV energy to a dosage sufficient to facilitate the deposition process. In the preferred embodiment, the dose of silicon ions is approximately $8 \times 10^{16}/cm^2$. However, a higher dosage and/or a lower energy can also be employed and still be within the scope and spirit of the present invention. Furthermore, in alternative embodiments palladium, copper, gold or silver ions instead of silicon may be implanted such that the surface 231 at the bottom of said channels 220 and 222 is modified, thus promoting selective electroless metal deposition. This ion implantation, either in the preferred embodiment or in the alternative embodiments will modify the bottom surface 231 of the etched interconnect channels as shown in FIG. 7. The modification of the exposed surface 231 initiates the selective electroless metal deposition by providing a reactive catalytic surface.

The photoresist layer 204 is then removed after ion implantation, using any well-known prior art methods of photoresist removal, leaving the upper surface 205 of the wafer 10 exposed. If said photoresist layer 204 is comprised of a combination of photoresist and an inorganic layer, such as silicon nitride, both layers are simultaneously removed using any well-known prior art processes. Once the photoresist layer 204 is removed, as shown in FIG. 8, a copper or gold film is electrolessly deposited, creating metal interconnect lines 240 and 242, as shown in FIG. 9. The selective electroless deposition process will not deposit copper or gold film on the regular unmodified surface of said dielectric film 203.

Once the fabrication process has progressed to FIG. 8, the selective electroless deposition process typically proceeds in the following sequence.

| Step # | Process | Time |
|---|---|---|
| 1 | wetting | 1 minute |
| 2 | cleaning | 20–60 seconds |
| 3 | rinsing in water | 1 minute |
| 4 | activation | 30 seconds |
| 5 | rinsing in water | 2 minutes |
| 6 | deposition | variable |
| 7 | rinsing in water | 2 minutes |

First, the wafter 10 is immersed in a deionized water bath with ultrasonic agitation to obtain better wetting of the surfaces. This step enables the air trapped in the small patterns to escape. Then a cleaning or etching step removes part of the dielectric layer and exposes the peak of silicon implant and simultaneously cleaning the surface. The composition of a typical cleaning solution in the preferred embodiment comprises deionized (DI) water and HF, in an approximate ratio of 9:1. However, the ratio of DI water to HF can range from 5:1 to 50:1. The wafer 10 is then rinsed in DI water to remove any residual acid. After the wafer 10 has been cleaned and rinsed, the modified surface 231 is activated for more efficient metal deposition. This activation step may not be necessary if the implantation dose is sufficiently high. The activation solution as described below displaces some of the silicon (Si) atoms with palladium (Pd) atoms, since Pd atoms are catalytically more reactive for copper (Cu) deposition than are Si atoms.

| Typical Activation Solution | |
|---|---|
| PdCl$_2$ | 0.001 mole/Liter |
| HCl | 0.004 mole/Liter |
| Acetic acid | 8.3 mole/Liter |
| HF | 0.13 mole/Liter |

After the surface 231 is activated and subsequently rinsed, the wafer 10 is immersed in a copper deposition solution. The deposition time is determined by the desired thickness of the interconnect lines and the deposition rate. An example of a deposition solution used in the preferred embodiment is described below:

| Typical Copper Deposition Solution | |
|---|---|
| CuSO$_4$5H$_2$O | 7 gm/Liter |
| Sodium EDTA | 30 gm/Liter |
| NaOH | 10 gm/Liter |
| KCN | 0.2 mg/Liter |
| CH$_2$O | 10 ml/Liter |
| Gafac RE610* | 3 gm/Liter |
| NH$_4$F/HF | 3 gm/Liter |
| Final pH | >12.5 |

*NOTE: Gafac RE610 is a surfactant used to improve surface wetting and is a trademark of Gafac Company.

Using the above-referenced deposition solution of the preferred embodiment, the rate of deposition at 70° C. is approximately 1.2 micrometers per hour. After the interconnect channels 220 and 222 are completely filled to provide a planar top surface level with the top surface 205 of the wafer 10, the wafer 10 is finally rinsed with water.

Although the preferred embodiment uses copper as a deposition film for the metal interconnect lines, an alternative deposition solution using gold (Au) may also be used. An example of a gold deposition solution used in an alternative embodiment is described below.

| Typical Composition for Gold Deposition | |
|---|---|
| KAu(CN)$_2$ | 5 gm/Liter |
| KCN | 13 gm/Liter |
| KOH | to adjust pH |
| KBH$_4$ | 10 gm/Liter |
| Final pH | >13 |

Although gold is somewhat more costly, it is more resistive to a corrosive environment. Furthermore, as state earlier, gold like copper has an activation energy of self diffusion in the range of 0.85-1.0 eV. Like copper, gold can be operated at considerably higher current densities than the traditional aluminum films or aluminum alloys without suffering from electromigration effects.

As a result of this present invention, metal films previously difficult to etch, for example copper, silver or gold, can be used in multi-level interconnection. The present invention provides the possibility of a fully planar surface and provides the possibility of patterning difficult-to-etch metal films. In the age of very dense VLSI devices the present invention meets the circuit requirements that are much more demanding and the process described in this invention can provide an improved alternative to the traditional interconnection processing.

Although the present invention has been described in terms of a preferred embodiment, it will be apparent that variations and modifications may be made without departing from the spirit and scope thereof, as set forth in the following claims.

We claim:

1. A method for forming a planar interconnect level for VLSI devices comprising:
    forming on a surface of a VLSI wafer a first dielectric layer having a planar top surface;
    forming a masking layer on said first dielectric layer;
    patterning said masking layer to define in said masking layer at least one location where an interconnect channel is to be formed;
    etching said first dielectric layer at said location through said patterned masking layer to form an interconnect channel in said first dielectric layer;
    implanting ions into the bottom surface of said interconnect channel, said ions forming a modified bottom surface of said interconnect channel to receive selective electroless metal deposition;
    removing said patterned masking layer; and
    depositing copper onto said modified bottom surface of said interconnect channel by selective electroless metal deposition, said deposition continuing until said interconnect channel is filled to a level substantially coincidence with the top surface of said first planar dielectric layer to thereby form a metal interconnect line, said metal interconnect line and said first dielectric layer forming a first planar interconnect level.

2. The method of claim 1, wherein the steps of patterning said masking layer and etching said first dielectric layer produce plural interconnect channels.

3. The method of claim 2, wherein said selective electroless metal deposition fills said plural interconnect channels to form plural interconnect lines.

4. The method of claim 3, wherein said interconnect lines are so positioned that adjacent interconnect lines are separated by a distance of less than 2 $\mu$m, said interconnect lines having a low electrical resistance and a high resistance to electromigration and stress migration.

5. The method of claim 1, wherein said planar first dielectric layer is formed by chemical vapor deposition of silicon dioxide.

6. The method of claim 1, wherein said masking layer is comprised of a combination of a photoresist layer and a second dielectric layer, said second dielectric layer deposited on said planar first dielectric layer prior to depositing said photoresist layer.

7. The method of claim 1, wherein said ions are silicon ions.

8. A method for forming a planar interconnect level for VLSI devices comprising:
    forming on a surface of a VLSI wafer a first dielectric layer having a planar top surface;
    forming a masking layer on said first dielectric layer;
    patterning said masking layer to define in said masking layer at least one location where an interconnect channel is to be formed;
    etching said first dielectric layer at said location through said patterned masking layer to form an interconnect channel in said first dielectric layer;
    implanting metal ions, selected from a group consisting of palladium, copper, gold, and silver, into the bottom surface of said interconnect channel, said metal ions forming a modified bottom surface of said interconnect channel to receive selective electroless metal deposition;
    removing said patterned masking layer; and depositing copper onto said modified bottom surface of said interconnect channel by selective electroless metal deposition, said deposition continuing until said interconnect channel is filled to a level substantially coincidence with the top surface of said first planar dielectric layer to thereby form a metal interconnect line, said metal interconnect line and said first dielectric layer forming a first planar interconnect level.

9. The method of claim 8, wherein the steps of patterning said masking layer and etching said first dielectric layer produce plural interconnect channels.

10. The method of claim 9, wherein said selective electroless metal deposition fills said plural interconnect channels to form plural interconnect lines.

11. The method of claim 10, wherein said interconnect lines are so positioned that adjacent interconnect lines are separated by a distance of less than 2 $\mu$m, said interconnect lines having a low electrical resistance and a high resistance to electromigration and stress migration.

12. The method of claim 8, wherein said planar first dielectric layer is formed by chemical vapor deposition of silicon dioxide.

13. The method of claim 8, wherein said masking layer is comprised of a combination of a photoresist layer and a second dielectric layer, said second dielectric layer deposited on said planar first dielectric layer prior to depositing said photoresist layer.

* * * * *